United States Patent
Lin et al.

(10) Patent No.: US 10,141,507 B2
(45) Date of Patent: Nov. 27, 2018

(54) BIASED PLASMA OXIDATION METHOD FOR ROUNDING STRUCTURE

(71) Applicant: Macronix International Co., Ltd., Hsinchu (TW)

(72) Inventors: Yu-Yu Lin, Hsinchu (TW); Feng-Min Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/723,315

(22) Filed: May 27, 2015

(65) Prior Publication Data

US 2016/0351805 A1 Dec. 1, 2016

(51) Int. Cl.
| | |
|---|---|
| H01L 25/065 | (2006.01) |
| H01L 23/498 | (2006.01) |
| H01L 23/528 | (2006.01) |
| H01L 23/31 | (2006.01) |
| H01L 45/00 | (2006.01) |
| H01L 27/24 | (2006.01) |
| G11C 13/00 | (2006.01) |

(52) U.S. Cl.
CPC ...... *H01L 45/1633* (2013.01); *H01L 27/2436* (2013.01); *H01L 45/04* (2013.01); *H01L 45/08* (2013.01); *H01L 45/1233* (2013.01); *H01L 45/1253* (2013.01); *H01L 45/146* (2013.01); *G11C 13/0007* (2013.01)

(58) Field of Classification Search
CPC ............... H01L 45/146; H01L 45/1633; H01L 21/76883; H01L 21/76888; H01L 45/1641; H01L 45/165; H01L 45/1675
See application file for complete search history.

(56) References Cited

U.S. PATENT DOCUMENTS

| | | | | |
|---|---|---|---|---|
| 4,729,815 A | * | 3/1988 | Leung | H01L 21/3065 257/E21.218 |
| 6,037,268 A | * | 3/2000 | Dautartas | C04B 41/009 216/24 |
| 7,252,852 B1 | * | 8/2007 | Parkin | B82Y 25/00 257/E43.006 |
| 7,943,920 B2 | | 5/2011 | Chien et al. | |
| 8,279,656 B2 | | 10/2012 | Chien et al. | |
| 8,921,200 B2 | * | 12/2014 | Kawashima | H01L 27/2436 438/381 |
| 8,969,844 B1 | | 3/2015 | Wang | |

(Continued)

OTHER PUBLICATIONS

C. H. Ho, "A Highly Reliable Self-Aligned Graded Oxide WOx Resistance Memory: Conduction Mechanisms and Reliability" Symp. VLSI Tech., pp. 228-229, 2007.*

(Continued)

*Primary Examiner* — Tom Thomas
*Assistant Examiner* — John Bodnar
(74) *Attorney, Agent, or Firm* — Haynes Beffel & Wolfeld LLP

(57) ABSTRACT

The present invention relates to metal oxide based memory devices and methods for manufacturing such devices, and more particularly to memory devices having data storage materials based on metal oxide compounds fabricated with a biased plasma oxidation process which improves the interface between the memory element and a top electrode for a more a uniform electrical field during operation, which improves device reliability.

8 Claims, 7 Drawing Sheets

(56) References Cited

U.S. PATENT DOCUMENTS

| | | |
|---|---|---|
| 2004/0113232 A1 | 6/2004 | Johnson et al. |
| 2005/0247921 A1 | 11/2005 | Lee et al. |
| 2007/0241319 A1 | 10/2007 | Chang |
| 2008/0304312 A1* | 12/2008 | Ho ................ B82Y 10/00 365/148 |
| 2008/0308781 A1* | 12/2008 | Liao ............... H01L 45/145 257/2 |
| 2009/0154222 A1 | 6/2009 | Chien et al. |
| 2009/0269918 A1 | 10/2009 | Ma et al. |
| 2010/0308298 A1 | 12/2010 | Ninomiya et al. |
| 2011/0002155 A1 | 1/2011 | Arita et al. |
| 2011/0140069 A1 | 6/2011 | Inoue |
| 2012/0104350 A1* | 5/2012 | Himeno ............ H01L 45/08 257/4 |
| 2012/0319071 A1* | 12/2012 | Awaya ............ G11C 13/0007 257/4 |
| 2013/0082230 A1* | 4/2013 | Katayama ......... H01L 45/145 257/4 |
| 2013/0178042 A1* | 7/2013 | Ninomiya .......... H01L 45/08 438/382 |
| 2013/0228735 A1* | 9/2013 | Higuchi ............ H01L 45/08 257/4 |
| 2014/0264232 A1 | 9/2014 | Lee et al. |

OTHER PUBLICATIONS

Baik, I.G., "Highly Scalable Non-volatile Resistive Memory using Simple Binary Oxide Driven by Asymmetric Unipolar Voltage Pulses," IEEE IEDM Dec. 13-15, 2004, 4 pages.

Chen, AN, et al., "Non-Volatile Resistive Switching for Advanced Memory Applications," IEEE IEDM, Dec. 5-7, 2005, 4 pages.

Kozicki, Michael N., et al., "A Low-Power Nonvolatile Switching Element Based on Copper-Tungsten Oxide Solid Electrolyte," IEEE Trans. on Nanotechnology, V. 5, No. 5, Sep. 2006, 10 pages.

U.S. Appl. No. 14/750,801, filed Jun. 25, 2015 entitled "Capped Contact Structure With Variable Adhesion Layer Thickness," Inventors Yu-Yu Lin, et al., 27 pages.

Office Action in U.S. Appl. No. 14/750,801 dated Apr. 10, 2017, 10 pages.

* cited by examiner

BIASED PLASMA OXIDATION METHOD FOR ROUNDING STRUCTURE

BACKGROUND OF THE INVENTION

Field of the Invention

The present invention relates to metal oxide based memory devices and methods for manufacturing such devices; and more particularly to memory devices having data storage materials based on metal oxide compounds fabricated with a biased plasma oxidation process which improves the interface between the memory element and a top electrode for a more uniform electrical field during operation, which improves device reliability.

Description of Related Art

Resistive random access memory, RRAM or ReRAM, is a type of nonvolatile memory that provides the benefits of small cell size, scalability, ultrafast operation, low-power operation, high endurance, good retention, large On/Off ratio, and CMOS compatibility. One type of RRAM includes a metal oxide layer than can be caused to change resistance between two or more stable resistance ranges by application of electrical pulses at levels suitable for implementation in integrated circuits, and the resistance can be read and written with random access to indicate stored data.

RRAM memory may include a metal oxide memory element in a current path between first and second electrodes. The electrodes may be terminals to access devices and/or may be coupled to access lines such as bit, word, and source lines. The access lines are connected to circuitry to perform operations, such as SET and RESET operations, which may operate to change the state of the memory element in order to store data.

In prior methods of forming a memory element of an RRAM memory cell, a metal plug, such as a tungsten plug, is deposited using chemical vapor deposition (CVD). The tungsten plug is oxidized through rapid thermal oxidation. This oxidation process creates a layer of metal oxide that is the memory element of the memory cell. A top electrode material electrode is deposited onto this oxidized surface. However, the oxidized surface created by this oxidation process is rough, which may result in a non-uniform electrical field during operation and affect device reliability. Further, the resulting memory cells fabricated with this process have a relatively low resistance, and the consistency of resistance from cell to cell is low, and therefore the cells in a single device have a wide range of resistances.

It is therefore desirable to provide a memory cell and method of manufacture that provides a uniform electrical field during operation. It is further desirable to provide a memory cell and method of manufacture that has increased cell resistance and improved consistency of resistances with other memory cells within a device.

SUMMARY

Memory devices based on metal oxide memory layers, for example tungsten-oxide, are described along with methods for manufacturing.

An example of a memory device comprises first and second electrodes with a memory element located between and electrically coupled to the first and second electrodes. In an example embodiment, the memory element comprises rounded edges and a smooth arcuate interface with the second electrode.

An example of a method of fabricating a memory device is carried out as follows. A bottom element in the form of an interlayer conductor, such as a tungsten plug, is deposited using chemical vapor deposition in a via formed in an insulating layer. The tungsten plug is oxidized through a process such as rapid thermal oxidation and a metal oxide layer is created. The oxidized portion of the tungsten plug has an increased volume and a rougher surface than the plug from which it was formed. A biased plasma oxidation process is then performed which reduces the volume of oxidized material in the metal oxide layer and further oxidizes at least some portion of the remaining metal oxide in the metal oxide layer. Further, this biased plasma oxidation process creates a smooth and rounded arcuate surface to deposit a top electrode and also improves the oxygen distribution in the metal oxide layer. Depositing a top electrode on the smooth rounded arcuate surface results in a more uniform electrical field during operation than if the biased plasma oxidation step was not performed. Further, the resulting memory cells manufactured with the biased plasma oxidation process have an increased resistance that is more consistent from cell to cell than without the biased plasma oxidation step. The method of fabricating a memory device may further include forming circuitry for performing read operations, and write operations (such as SET and RESET operations). In embodiments, and memory element may be created from an un-oxidized interlayer conductor using a biased plasma oxidation as discussed above.

The structure and methods of the present invention are disclosed in the detailed description below. Other aspects and advantages of the present invention can be seen on review of the drawings, the detailed description and the claims, which follow.

BRIEF DESCRIPTION OF THE DRAWINGS

The invention will be described with respect to the specific embodiments thereof, and reference will be made to the drawings, in which.

DETAILED DESCRIPTION

Figure 1A:
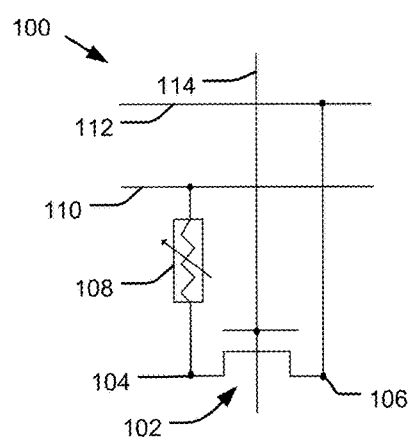
FIG. 1A is a schematic of a memory cell in accordance with an embodiment.

The following description of the disclosure will typically be with reference to specific structural embodiments and methods. It is to be understood that there is no intention to limit the disclosure to the specifically disclosed embodiments and methods, but that the disclosure may be practiced using other features, elements, methods and embodiments. Preferred embodiments are described to illustrate the present disclosure, not to limit its scope, which is defined by the claims. Those of ordinary skill in the art will recognize a variety of equivalent variations on the description that follows. Like elements in various embodiments are commonly referred to with like reference numerals.

FIG. 1A illustrates a schematic of a memory cell 100 in accordance with an embodiment. The memory cell 100 includes an access device in the form of a transistor 102 with a first terminal 104 and a second terminal 106. The memory cell further includes a memory element 108 located between the first terminal 104 and a first access line 110, in the example a bit line, and a second access line 112, in the example a source line, connected to the second terminal 106. In the embodiment shown with the access device being transistor 102, the memory device further includes a third access line 114, in the example a word line, connected to the gate of the transistor 102. Alternatively, in embodiments, the access device may be a diode, such as is shown in the cross-point array of memory cells 100 in FIG. 1B and, in such embodiments, a third access line is not included.

Figure 2:
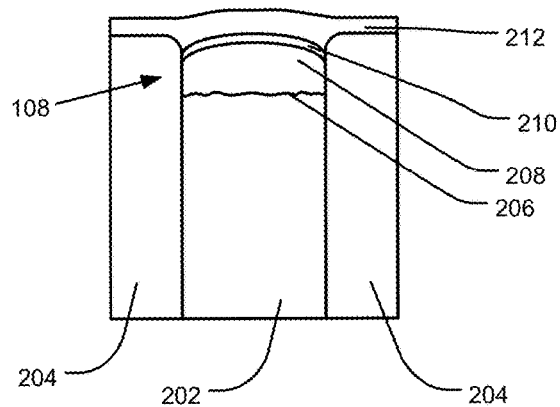
FIG. 2 is a simplified cross-sectional view of a first example of a variable resistance memory element.

FIG. 2 is a simplified cross-sectional view of a first example of a variable resistance memory element 108. An interlayer conductor 202 extends through an insulating dielectric layer 204, for example a silicon dioxide layer. The interlayer conductor 202 on one end may be coupled to an access device, such as a drain terminal of an access transistor or a terminal of a diode. In the embodiment discussed, the interlayer conductor 202 is a tungsten plug. However, in embodiments, the material of the interlayer conductor could be other metals such as Ti, Ta, Al, TiN, TaN, Cu and Hf. Further, in embodiments, the interlayer conductor is surrounded by a liner layer, such as a TiN liner.

The memory element 108 is located on an electrode surface 206 of the interlayer conductor 202. The memory element has a smooth rounded domelike surface, which is illustrated by the arcuate profile in the cross section of FIG. 2. In the embodiment shown, the memory element 108 is programmable to at least two resistance states. In FIG. 2 the memory element is portrayed as including a distinct first layer of metal oxide 208 and a distinct second layer of metal oxide 210. However, in embodiments, the first and second metal oxide layers may or may not have a distinct boundary, however they are heuristically referred to herein as first and second layers in order to convey that embodiments of memory elements are fabricated with two distinct oxidation processes as discussed below. The first 208 and second 210 metal oxide layers may each comprise one or more tungsten-oxygen compounds (WOx), for example one or more of $WO_3$, $W_2O_5$, $WO_2$. The second metal oxide layer 210 is fabricated with a biased plasma oxidation process discussed below. On top of the memory element 108, specifically the second metal oxide layer 210, is a top electrode 212, in this embodiment an access line.

A memory cell, specifically the memory element portion, can be formed by the manufacturing steps illustrated in FIGS. 3A-3D. The illustrations of the processes highlight the memory element component of the memory cell and omit an access device and components of the memory cell that are specific to particular access devices and access line and array configurations.

Figure 3A:
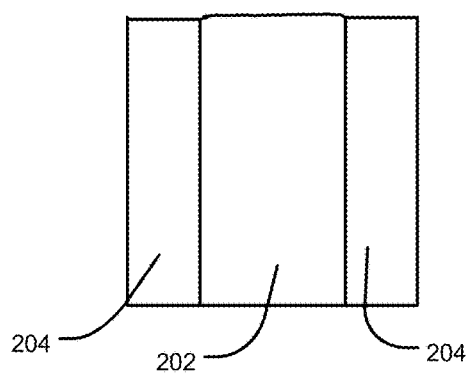
FIGS. 3A, 3B, 3C, 3D are schematic illustrations of the steps of manufacture of a memory cell in accordance with an embodiment.

As shown in FIG. 3A, interlayer conductors 202 are formed through vias in the dielectric insulator layer 204 so that the bottom end of the interlayer conductor 202 contacts an access line or terminal of an access device. In the embodiment shown, the interlayer conductor 202 is a tungsten plug. The tungsten plug may be formed within the vias by chemical vapor deposition of tungsten material. The resulting plug is self-aligned within the via. In embodiments, after the forming of the plug, a planarization step such as chemical mechanical polishing may be performed.

Figure 3B:
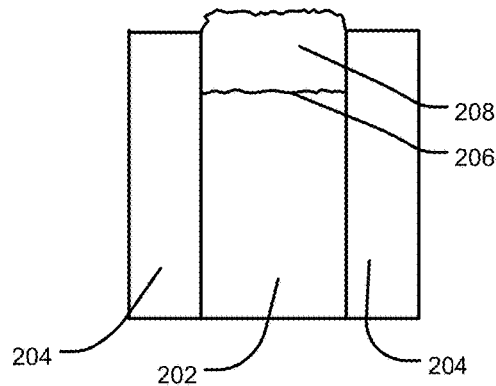

Next, an oxidation step takes place in which the top portion of the interlayer conductor is oxidized for a first time, resulting in the structure shown in FIG. 3B. For example, a thermal oxidation process may be done where the top portion of the interlayer conductor is exposed to 10 slm (standard liters per minute) of Oxygen gas at 500° C. for 1 minute. Forming the first metal oxide layer 208 on the interlayer conductor 202 in this way has the advantage of creating a self-aligned layer of metal oxide on the interlayer conductor. This first oxidizing step may comprise rapid thermal oxidation process. This oxidation process may cause expansion so that the oxidized material is up to about three times the volume of the un-oxidized material from which it is created. Further, the top surface of the oxidized surface is rougher than the previous un-oxidized surface of the interlayer conductor 202. The expansion and roughness is visible in FIG. 4B, which is a TEM image corresponding to FIG. 3B.

Figure 3C:
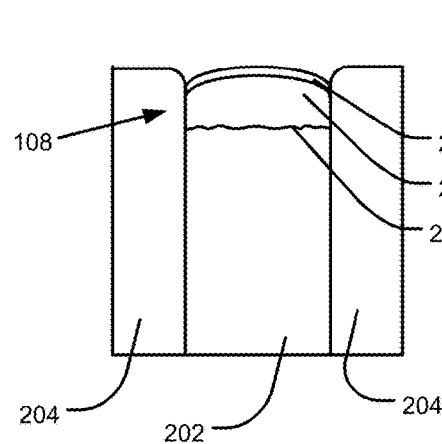
Figure 4B:
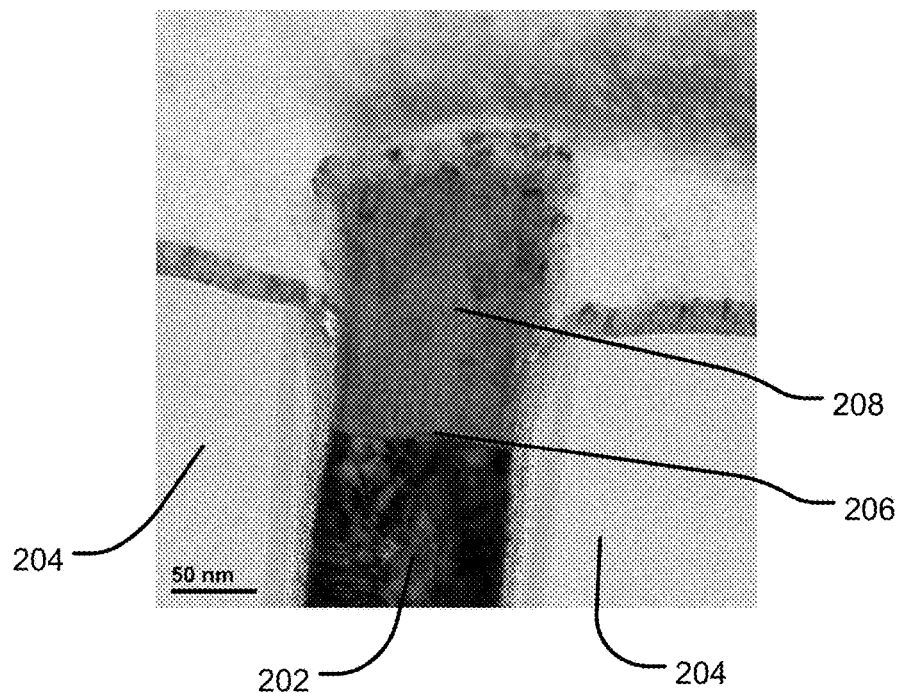
FIG. 4B is a TEM image corresponding to FIG. 3B.

The rough surface shown in FIGS. 3B and 4B is undesirable because depositing a top electrode 212 on the rough contact surface of the memory element 108 formed by an oxidized tungsten plug might result in a non-uniform interface and, as a result, curvature on the edges of the interlayer conductor, and spacing between the top and bottom electrodes through the metal oxide layer across may vary within a cell and from cell to cell. The varying spacing can result in a non-uniform electrical field occurring during device operation which would affect the device reliability. The varying curvature on the edges causes variations in the field enhancement on the corners, and can impact uniformity of device performance across the array. Therefore, a process is applied to form a smooth surface with more uniform rounding on the edges on the metal oxide memory element. To form a smooth surface, a biased plasma oxidation process can be performed after formation of the first metal oxide layer, resulting in the structure shown in FIG. 3C. As seen in FIG. 3C, the memory element 108 is modified by the bombardment and oxidation processes, and can include a combination of the first metal oxide layer 208 formed by oxidation of the interlayer conductor, and a second layer 210 formed by biased plasma oxidation.

A biased plasma oxidation process includes in the same procedure a bombardment effect similar to sputtering that can smooth the metal oxide layer surface, combined with an oxidation process that can further oxidize the top portion of the interlayer conductor containing previously oxidized material. As a result of the bombardment and oxidation, the metal oxide memory element 108 on the interlayer conductor has a surface that is smooth with a domelike shape with rounded corners as portrayed by the arcuate profile in FIG. 3C. The biased plasma oxidation process may also round the corners of the dielectric layer 204 around the interlayer conductor 202, and create a smooth surface to interface with a deposited top electrode. Further, the biased plasma oxidation process improves the oxygen distribution in the first metal oxide layer 208, which improves device performance.

The plasma used in biased plasma oxidation process may be from a single or multiple gases. The plasmas may serve the purpose of bombardment, oxidation, or a combination of the two. The plasma gas for bombardment could be Argon or/and oxygen and the oxidation plasma gas may be oxygen. Further, gases such as Nitrous Oxide ($N_2O$) may be used for both the bombardment and oxidation gas. The biased plasma oxidation process could be performed in one step or multiple steps, and may include separate bombardment and oxidation steps, and/or combination steps including bombardment and oxidation performed simultaneously. For example, the bombardment effect could come from the biased oxygen ion used for oxidation and the biased plasma oxidation process could therefore be done in a single step with a single gas.

The total amount of bombardment energy delivered to the target surface during steps of the biased plasma oxidation process involving bombardment and the initial roughness of the target surface are primary determining factors of the surface roughness of the finished memory element and therefore the uniformness of the interface between the memory element and top electrode. The amount of bombardment energy is dependent on the amount and type of bombardment plasmas, bias, power and duration of the bombardment step or steps. The thickness of the second metal oxide layer is dependent on the oxidation steps of the biased plasma oxidation process and may be controlled by the bias voltage, process time, pressure, and/or temperature of oxidizing steps. In embodiments, the layer 210 on the memory element is about 30~50 A thick.

Benefits of the rounded smooth structure of the tungsten oxide RRAM after the biased plasma oxidation process include a more uniform enhanced electrical field at the top corner of the interlayer connector across an array. The corner shape is critical for the operation conditions because the electrical field during operation is affected by the corner shape. The rounded structure further helps to reduce the corner shape variation and enhance the uniformity of the device and operation conditions. In embodiments it is desirable to have a surface roughness, $R_A$, of the top surface memory element less than 3 nm in RMS (root mean square), to promote a uniform electrical field during operation. The surface roughness, $R_A$, is a value determined by analyzing a cross-section of the memory element. The top portion of the cross-section corresponds to the profile of the top surface of the memory element. Through a fitting algorithm an equation is calculated which most closely fits the top portion of the cross-section. This equation defining the fitted line segment may be any equation including a line such as an arc or a parabola. The roughness is then calculated as the average deviation from the fitted line of the actual top profile portion of the cross-section in the direction normal to the fitted line.

Figure 3D:
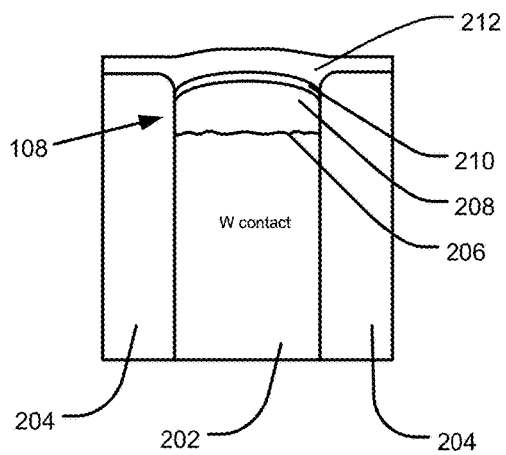
Figure 4D:
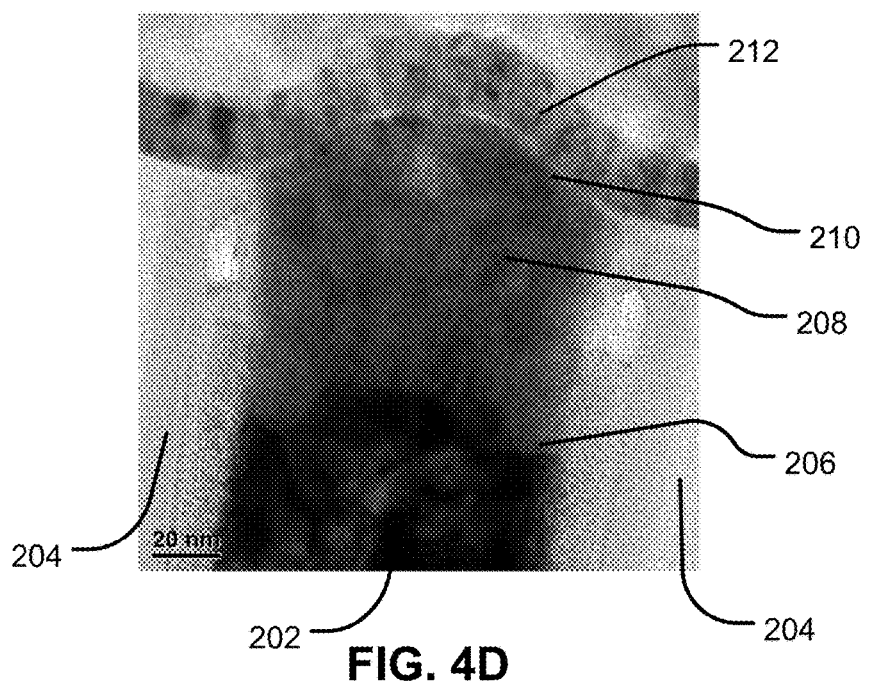
FIG. 4D is a TEM image corresponding to FIG. 3D.
Figure 5A:
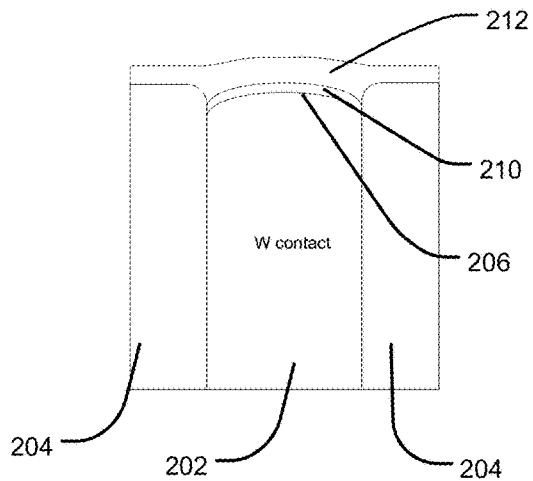
FIG. 5A is a simplified cross-sectional view of a second example of a variable resistance memory element.
Figure 5B:
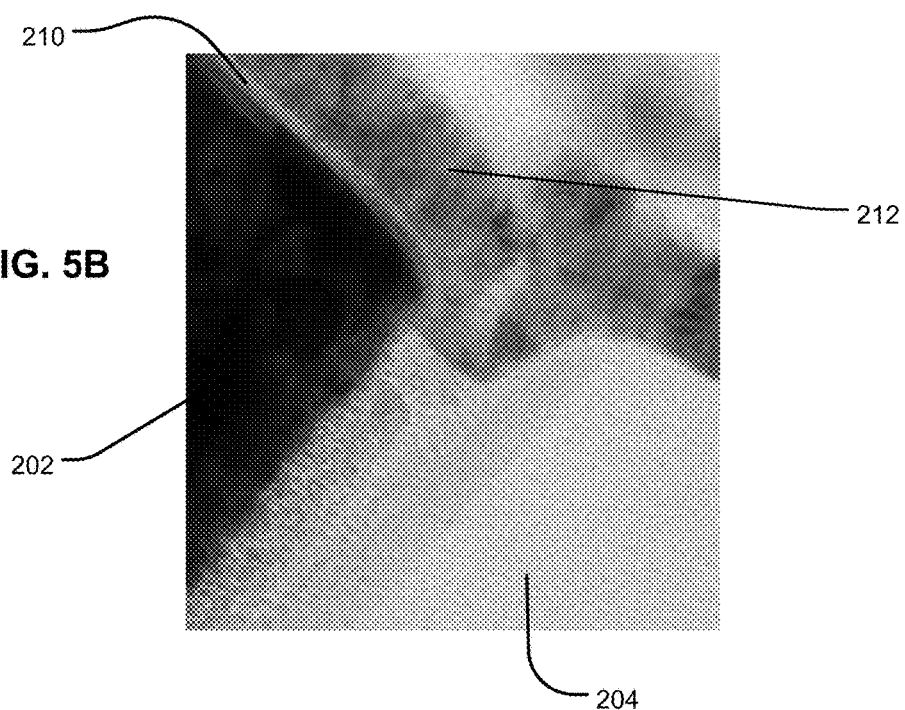
FIG. 5B is a TEM image corresponding to FIG. 5A.

FIG. 4D, corresponding to FIG. 3D, shows a TEM image of a portion of a memory cell created using a biased plasma oxidation process applied to oxidized tungsten plugs, such as is shown in FIG. 4B. The parameters of the process included: bias: 100V; RF power: 600 W; Time: 60 s*2 times. Alternative embodiments of the device and method of manufacture include biased plasma oxidation of an unoxidized interlayer conductor to create the memory element as is shown in FIGS. 5A and 5B showing a schematic illustration and a corresponding TEM image, wherein the memory element is comprised of a second metal oxide layer 210 fabricated in a process similar to the embodiment shown in FIGS. 3A-D. In FIG. 5B the interlayer conductor 202 tungsten plug was subjected to biased plasma oxidation with the following parameters: bias: 100V; RF power: 600 W; Time: 60 s.

Figure 6A:
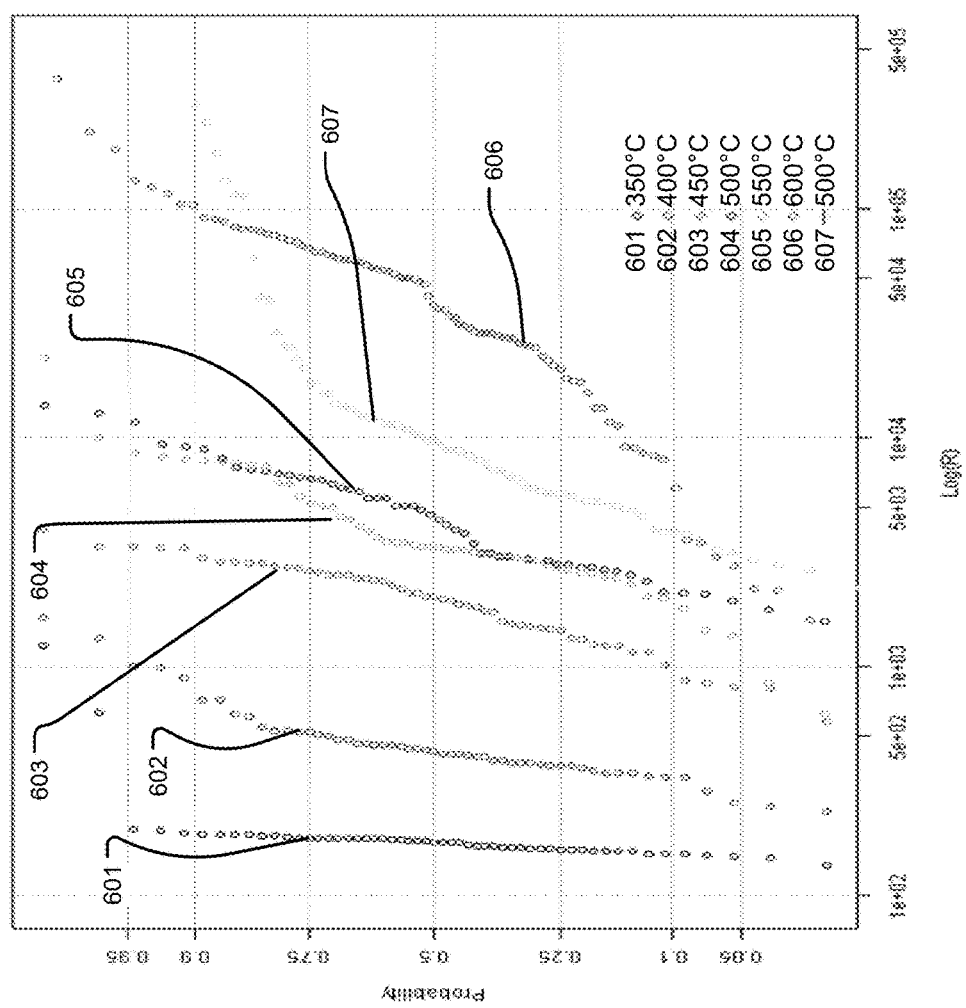
FIGS. 6A and 6B are a charts showing resistance distributions with different memory element forming processes.
Figure 6B:
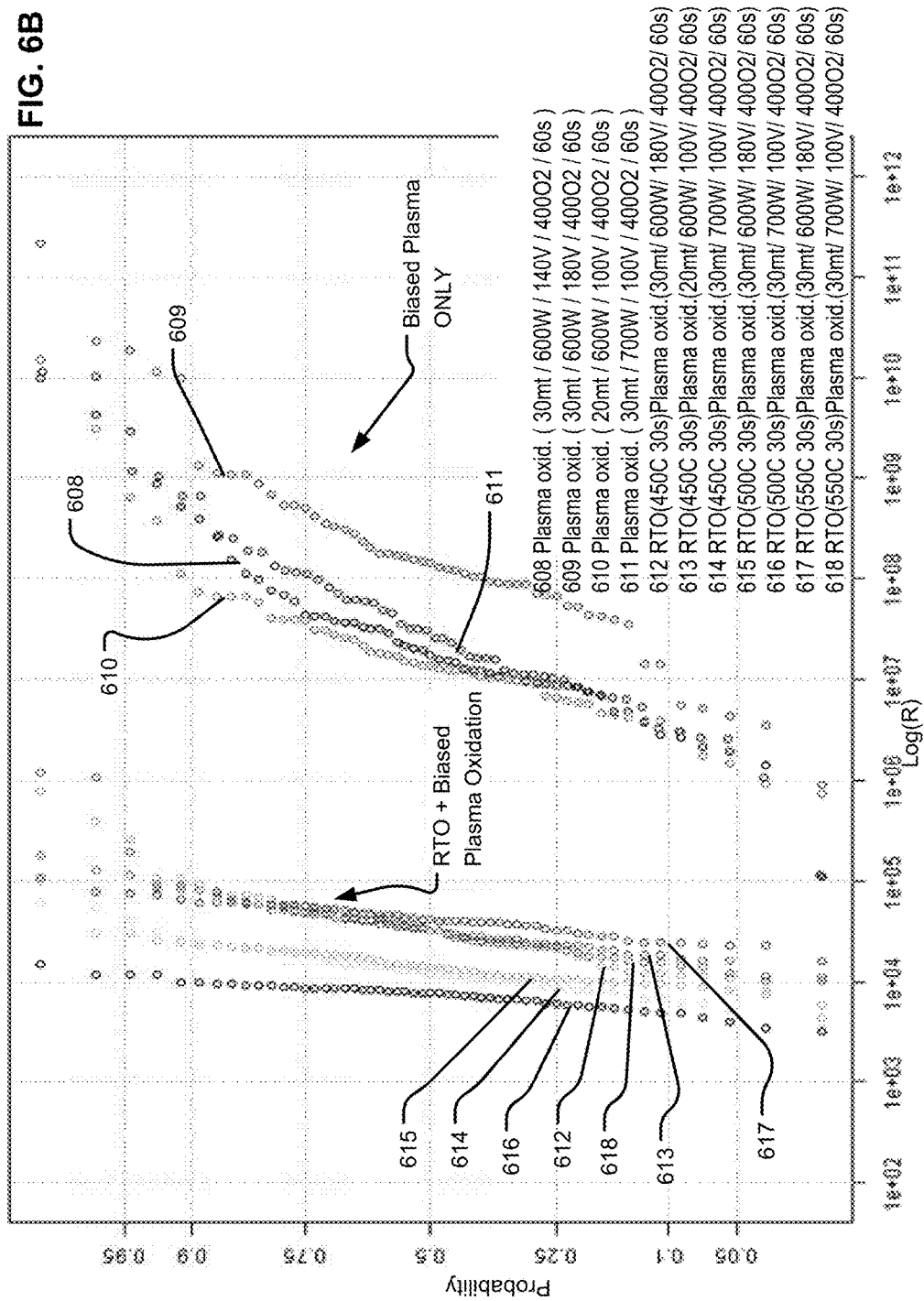

FIGS. 6A and 6B show resistance distributions of memory elements formed with different oxidation methods. FIG. 6A is a chart of various resistance distributions 601-607 with memory elements fabricated with only RTO under different temperature conditions. 6B is a chart of various resistance distributions 612-618 with memory elements fabricated with RTO+biased plasma oxidation on the left side of the chart, and various resistance distributions 608-611 with memory elements fabricated with biased plasma oxidation only on the right side of the chart, wherein each resistance distribution corresponds to different fabrication parameters including different RTO temperatures, and plasma oxidation pressures, wattages, and voltages. As shown, the resistance distribution of the RTO only is lower and wider than that of RTO+biased plasma oxidation, which leads to better device consistency and reliability. As is shown, if the initial resistance of the RTO is low, the additional plasma oxidation modifies the resistance range of the device to have a better operation condition with higher more consistent resistances. Further, as is shown, oxidation of a tungsten plug by biased plasma oxidation can create memory elements with resistances higher than both RTO only and RTO+biased plasma oxidation. Modification of the initial resistance gives an increase range to fine tune the operation condition, including the forming voltage, set/reset voltage and current, and endurance.

Figure 1B:
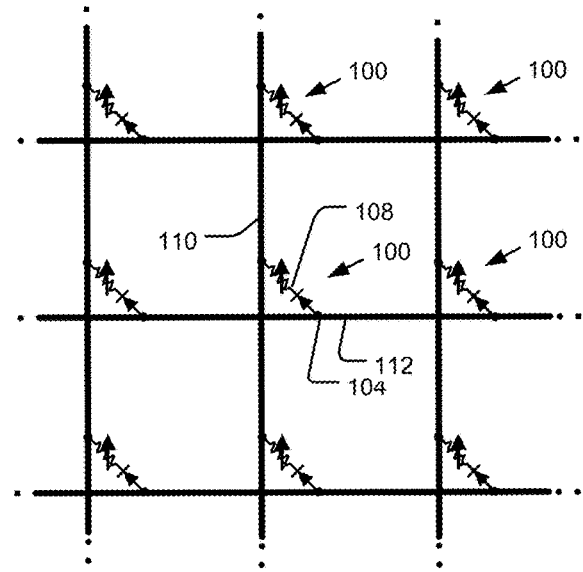
FIG. 1B is a schematic of a cross-point memory cell array in accordance with an embodiment.
Figure 7:
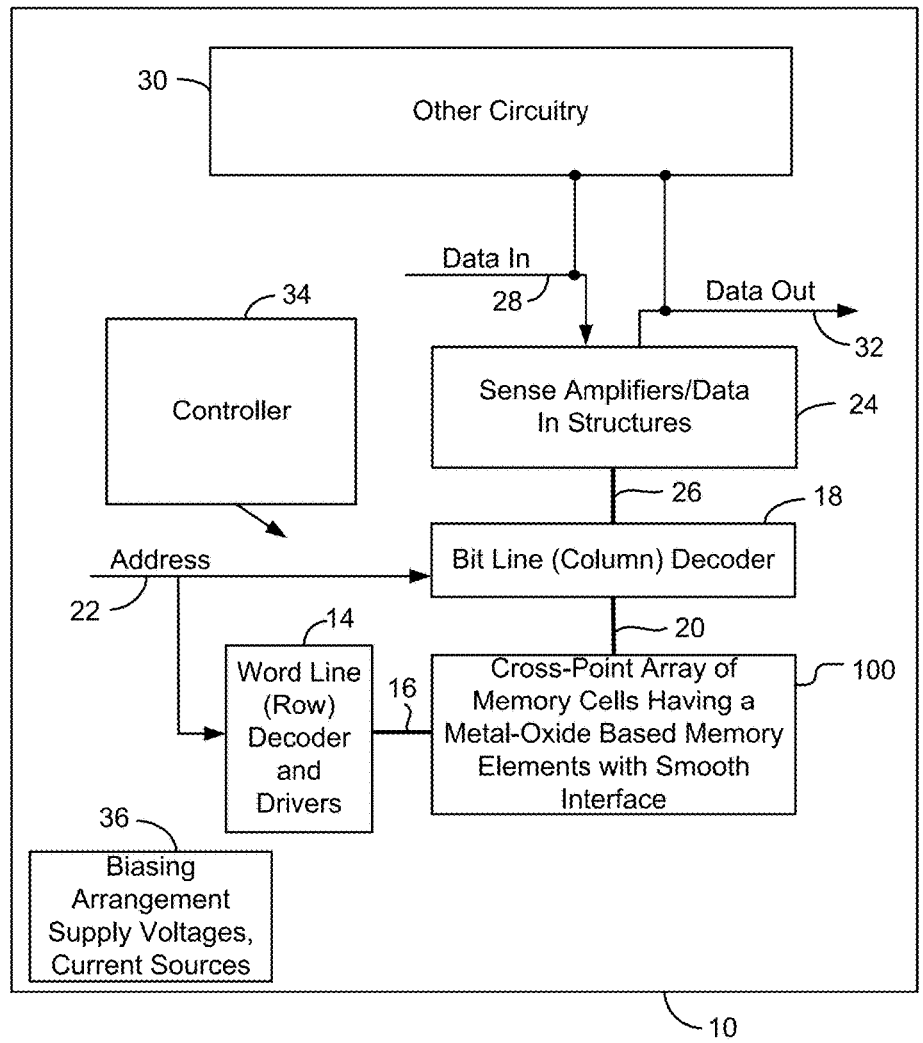
FIG. 7 is a simplified block diagram of an integrated circuit array in accordance with an embodiment.

FIG. 7 is a simplified block diagram of an integrated circuit 10 including a cross-point memory array of memory cells, such as is shown in FIG. 1B, having a metal-oxide based memory. A word line decoder 14 is coupled to and in electrical communication with a plurality of word lines 16. A bit line (column) decoder 18 is in electrical communication with a plurality of bit lines 20 to read data from, and write data to, the memory cells (not shown) in a array. Addresses are supplied on bus 22 to word line decoder and drivers 14 and bit line decoder 18. Sense amplifiers and data-in structures in block 24 are coupled to bit line decoder 18 via data bus 26. Data is supplied via a data-in line 28 from input/output ports on integrated circuit 10, or from other data sources internal or external to integrated circuit 10, to data-in structures in block 24. Other circuitry 30 may be included on integrated circuit 10, such as a general purpose processor or special purpose application circuitry, or a combination of modules providing system-on-a-chip functionality supported by array 100. Data is supplied via a data-out line 32 from the sense amplifiers in block 24 to input/output ports on integrated circuit 10, or to other data destinations internal or external to integrated circuit 10.

A controller 34 implemented in this example, using a bias arrangement state machine, controls the application of bias arrangement supply voltages 36, such as read, program, and program verify voltages. Controller 34 may be implemented using special-purpose logic circuitry as known in the art. In alternative embodiments, controller 34 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 34.

It will be understood that the memory array is not limited to the array configuration illustrated in FIG. 1B and additional array configurations can also be used with memory cells including the memory element disclosed above.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of making a memory cell, comprising:
forming an interlayer conductor extending from an upper surface to a lower surface of an insulation layer, wherein a first end of the interlayer conductor is coupled to a terminal of an access device, and a second end of the interlayer conductor has a top surface coplanar with the upper surface of the insulation layer; and
forming a memory element from the second end of the interlayer conductor including:
a bombardment step which smooths and rounds edges of a top portion of the memory element, and rounds edges of the insulation layer proximate to the memory element, and
an oxidation step creating metal oxide in the memory element.

2. The method of claim 1, wherein the bombardment step and oxidation step are performed on a metal oxide material.

3. The method of claim 1, wherein, after the bombardment and oxidation steps, the memory element has a top surface of a metal oxide material with a surface roughness less than 3 nm.

4. The method of claim 1, wherein the bombardment and oxidation steps are included in a biased plasma oxidation process.

5. The method of claim 4, wherein the biased plasma oxidation process is performed on a metal oxide layer formed by thermal oxidation of the interlayer conductor.

6. The method of claim 1, wherein the memory element essentially consists of oxides of a metal material of the interlayer conductor.

7. The method of claim 1, the memory element is characterized by having a programmable resistance.

8. A method of making a memory cell, comprising:
forming an interlayer conductor extending from an upper surface to a lower surface of an insulation layer, wherein a first end of the interlayer conductor is coupled to a terminal of an access device, and a second end of the interlayer conductor has a top surface coplanar with the upper surface of the insulation layer; and
forming a memory element on the second end of the interlayer conductor comprising:
oxidizing a portion of the second end of the interlayer conductor;
applying a bombardment process during or after said oxidizing so that a layer of metal oxide is formed having a surface with a surface roughness RA less than 3 nm; and
depositing an electrode material on the layer of metal oxide,
wherein the bombardment process rounds edges of the layer of metal oxide and edges of the insulation layer proximate to the memory element.

* * * * *